(12) United States Patent
Endo et al.

(10) Patent No.: US 11,202,379 B2
(45) Date of Patent: Dec. 14, 2021

(54) ELECTRONIC APPARATUS

(71) Applicant: Panasonic Intellectual Property Management Co., Ltd., Osaka (JP)

(72) Inventors: Keita Endo, Osaka (JP); Junichi Hasegawa, Osaka (JP); Noriyuki Maki, Osaka (JP); Takamitsu Suzuki, Osaka (JP); Naoki Hoshika, Osaka (JP); Kazuki Zusho, Osaka (JP); Riho Fukagawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/934,578

(22) Filed: Jul. 21, 2020

(65) Prior Publication Data
US 2021/0007231 A1 Jan. 7, 2021

Related U.S. Application Data

(63) Continuation of application No. PCT/JP2019/001843, filed on Jan. 22, 2019.

(30) Foreign Application Priority Data

Jan. 24, 2018 (JP) .............................. JP2018-009979

(51) Int. Cl.
*H05K 5/00* (2006.01)
*G06F 1/16* (2006.01)
(Continued)

(52) U.S. Cl.
CPC ......... *H05K 5/0069* (2013.01); *G06F 1/1635* (2013.01); *G06F 1/188* (2013.01);
(Continued)

(58) Field of Classification Search
CPC .. H05K 5/0069; H05K 1/0277; H05K 5/0008; H05K 7/1427; H05K 2201/10189;
(Continued)

(56) References Cited

U.S. PATENT DOCUMENTS

| 6,447,314 B1 | 9/2002 | Kato et al. |
| 2005/0095884 A1* | 5/2005 | Brodsky ............ H01R 13/6485 439/91 |

(Continued)

FOREIGN PATENT DOCUMENTS

| CN | 101192720 A | 6/2008 |
| JP | H05-082207 A | 4/1993 |

(Continued)

OTHER PUBLICATIONS

International Search Report for parent Application No. PCT/JP2019/001843, dated Mar. 26, 2019.

(Continued)

*Primary Examiner* — Pete T Lee
(74) *Attorney, Agent, or Firm* — Renner, Otto, Boisselle & Sklar, LLP

(57) ABSTRACT

An electronic apparatus includes a flexible printed circuit board having a main body on which wiring pattern is formed, a connector having a connection terminal connected to the wiring constituting the wiring pattern, and a base body on which the connection terminal is fixed, and a casing. The main body is attached to the casing to be movable, the flexible printed circuit board has an extension part protruding from the main body and extending along with a ground included in the wiring pattern, the extension part bends in the middle of extending to be capable of expansion and contraction, and has a mounting part fixed to the casing on the tip side thereof, the mounting part is provided with a ground terminal connected to the ground extended, and the (Continued)

ground terminal is electrically connected to the casing in the state that the mounting part is fixed to the casing.

7 Claims, 17 Drawing Sheets

(51) Int. Cl.
      *G06F 1/18*           (2006.01)
      *H01R 12/65*        (2011.01)
      *H01R 12/91*        (2011.01)
      *H01R 13/73*        (2006.01)
      *H05K 1/02*           (2006.01)
      *H05K 7/14*           (2006.01)

(52) U.S. Cl.
      CPC ............. *H01R 12/65* (2013.01); *H01R 12/91* (2013.01); *H01R 13/73* (2013.01); *H05K 1/0277* (2013.01); *H05K 5/0008* (2013.01); *H05K 7/1427* (2013.01); *H05K 2201/10189* (2013.01)

(58) Field of Classification Search
      CPC ....... G06F 1/1635; G06F 1/188; H01R 12/65; H01R 12/91; H01R 13/73
      See application file for complete search history.

(56) References Cited

U.S. PATENT DOCUMENTS

| | | | |
|---|---|---|---|
| 2006/0019520 A1 | 1/2006 | Kawase et al. | |
| 2007/0275579 A1* | 11/2007 | Si | H01R 13/6582 439/157 |
| 2010/0085688 A1* | 4/2010 | Stanley | H04M 1/0235 361/679.01 |
| 2012/0238118 A1* | 9/2012 | Yoshida | C25D 1/003 439/259 |
| 2013/0155638 A1* | 6/2013 | Lee | H05K 1/0215 361/799 |
| 2016/0105962 A1* | 4/2016 | Suzuki | H05K 1/118 174/251 |
| 2016/0205766 A1* | 7/2016 | Blum | H05K 5/0247 361/749 |
| 2016/0327986 A1* | 11/2016 | Farahani | G06F 1/1662 |
| 2020/0144749 A1* | 5/2020 | Chen | H01R 13/26 |

FOREIGN PATENT DOCUMENTS

| | | |
|---|---|---|
| JP | H05-082985 A | 4/1993 |
| JP | H05-290936 A | 11/1993 |
| JP | 2000-089851 A | 3/2000 |
| JP | 2000-231974 A | 8/2000 |
| JP | 2001-092564 A | 4/2001 |
| JP | 2005268592 | 9/2005 |
| JP | 2006-059788 A | 3/2006 |
| JP | 2008-262798 A | 10/2008 |
| JP | 2012-186093 A | 9/2012 |
| JP | 2017-017567 A | 1/2017 |

OTHER PUBLICATIONS

International Preliminary Report on Patentability corresponding application No. PCT/JP2019/001843 dated Jul. 28, 2020.
Office Action for corresponding Chinese Application No. 201980009580.1 dated Aug. 18, 2021 and its English Translation.

* cited by examiner

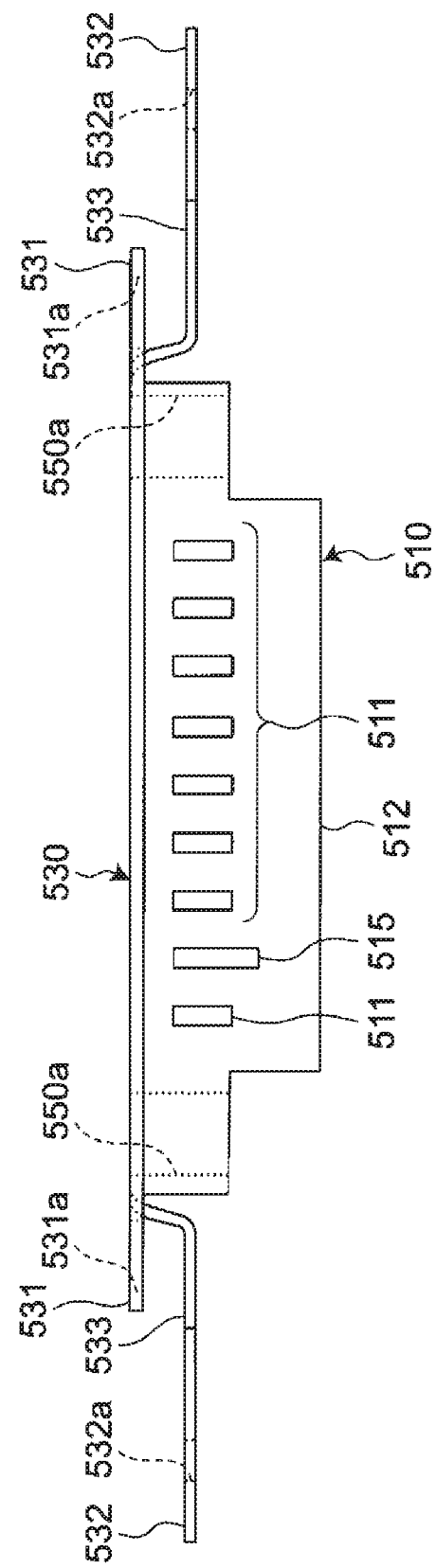

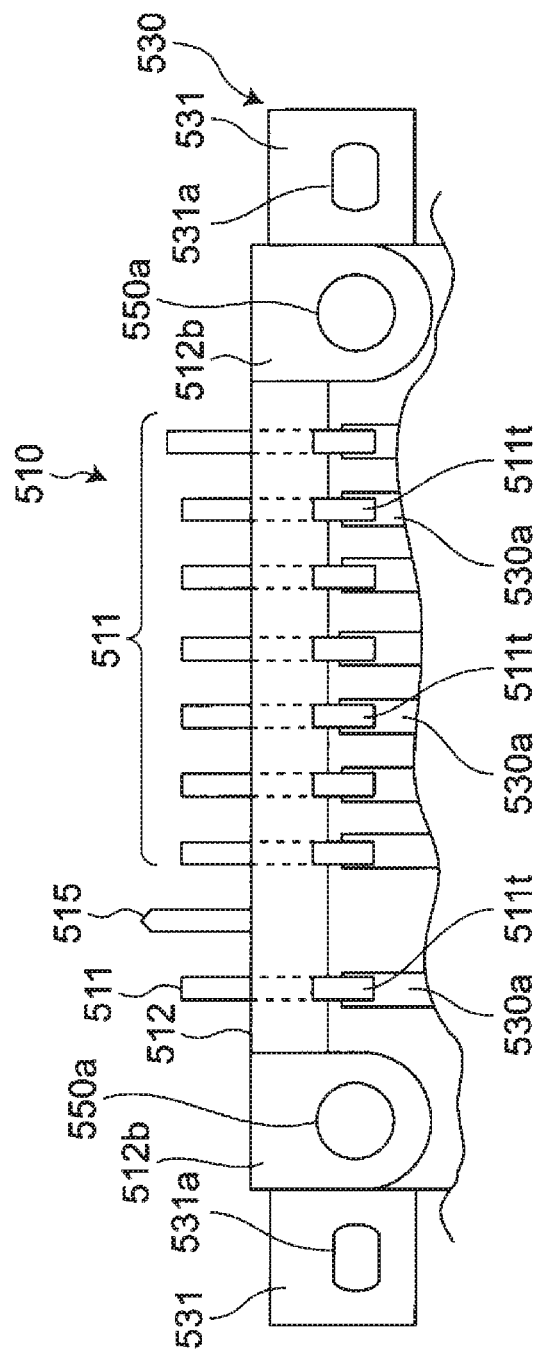

ELECTRONIC APPARATUS

CROSS-REFERENCE TO RELATED APPLICATIONS

This is a continuation application of International Application No. PCT/JP2019/001843, with an international filing date of Jan. 22, 2019, which claims priority of Japanese Patent Application No.: 2018-009979 filed on Jan. 24, 2018, the content of which is incorporated herein by reference.

BACKGROUND

1. Technical Field

The present disclosure relates to an electronic apparatus having a connector.

2. Related Art

JP-A-5-82985 discloses that a substrate having a connector for connection is configured to be movable in an electronic information device.

SUMMARY

The present disclosure provides an electronic apparatus capable of appropriately grounding a connector while allowing a connector provided in an electronic apparatus to move relative to a casing.

An electronic apparatus according to the present disclosure includes:

a flexible printed circuit board having a main body on which wiring pattern is formed, a connector having a connection terminal connected to the wiring constituting the wiring pattern, and a base body on which the connection terminal is fixed and has insulation property, and a casing housing the connector and the flexible printed circuit board, wherein the main body is attached to the casing so as to be movable, the flexible printed circuit board has an extension part protruding from the main body and extending along with a ground included in the wiring pattern, the extension part bends in the middle of extending to be capable of expansion and contraction, and has a mounting part fixed to the casing on the tip side thereof, the mounting part is provided with a ground terminal connected to the ground extended, and the ground terminal is electrically connected to the casing in the state that the mounting part is fixed to the casing.

According to the present disclosure, the connector can be properly ground-connected while allowing the connector provided in the electronic apparatus to be movable relative to the casing.

BRIEF DESCRIPTION OF DRAWINGS

FIG. 8A is an end view of a connection face of a connector of the flexible printed board unit;

FIG. 8B is an enlarged view of a fixed surface side of a connector of the flexible printed circuit board unit;

DETAILED DESCRIPTION

Hereinafter, embodiments be described as appropriate in detail with reference to the drawings. However, more detailed description than necessary may be omitted. For example, detailed descriptions of already well-known matters and repeated descriptions for substantially the same configuration may be omitted. This is to avoid the following description from becoming unnecessarily redundant and to facilitate understanding by those skilled in the art.

In addition, the inventor provides the accompany drawings and the following description in order for those skilled in the art to fully understand the present disclosure. The drawings and the description are not intended to limit the subject matter described in the claims.

Embodiment 1

Hereinafter, an embodiment 1 will be described with reference to the drawings.

1-1. Configuration

Figure 1:
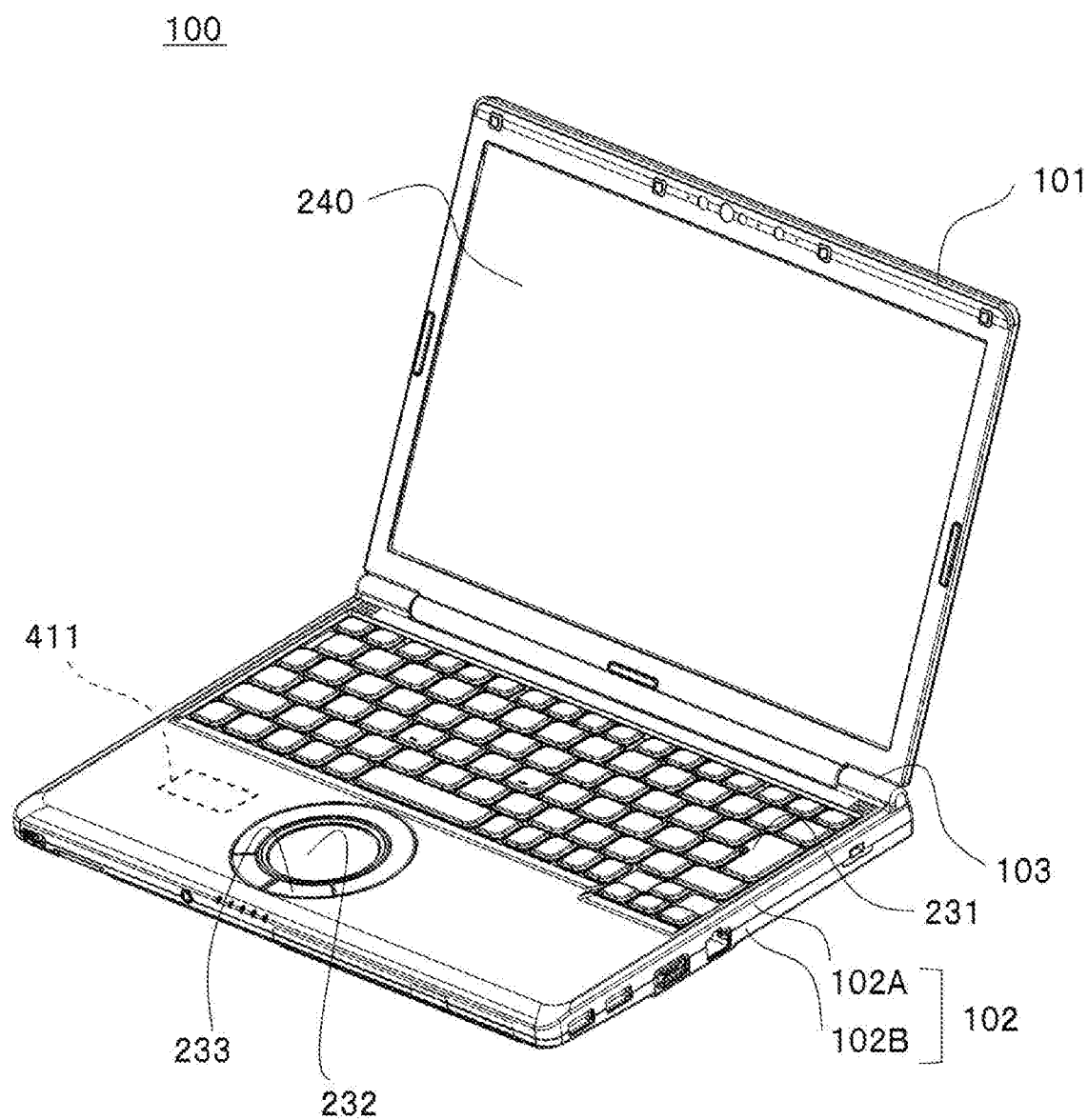
FIG. 1 is a perspective view of a computer according to embodiment 1.

FIG. 1 is a perspective view of a computer according to embodiment 1.

A computer 100 is an example of an electronic apparatus according to the present disclosure, and includes a first casing 101 and a second casing 102. The computer 100 is a notebook computer in which the first casing 101 and the second casing 102 are relatively rotatable through a hinge 103.

The first casing 101 is provided with a display 240.

The second casing 102 is provided with a keyboard 231, a touch pad 232, an operation button 233, and a CPU 411.

The display 240 displays an image or an image based on the input image signal. The display 240 is configured by a liquid crystal display, for example.

The keyboard 231 is provided with a plurality of keys. The keyboard 231 outputs a signal corresponding to a key pressed by a user.

The touch pad 232 is a pointing device that outputs a signal corresponding to a position touched by a user.

The operation button 233 is a pushdown button switch, and outputs a signal indicating that the button switch is pressed when pressed by a user. The operation button 233 used as a decision button, for example.

The CPU 411 controls the operation of the entire computer 100. The CPU 411 performs arithmetic processing based on an OS stored in a storage unit, various application programs, data stored in a storage unit, and information inputted from various input devices, and realizes various functions to be described later. The control unit 210 includes, for example, a CPU, an MPU, an FPGA, or the like.

Figure 2:
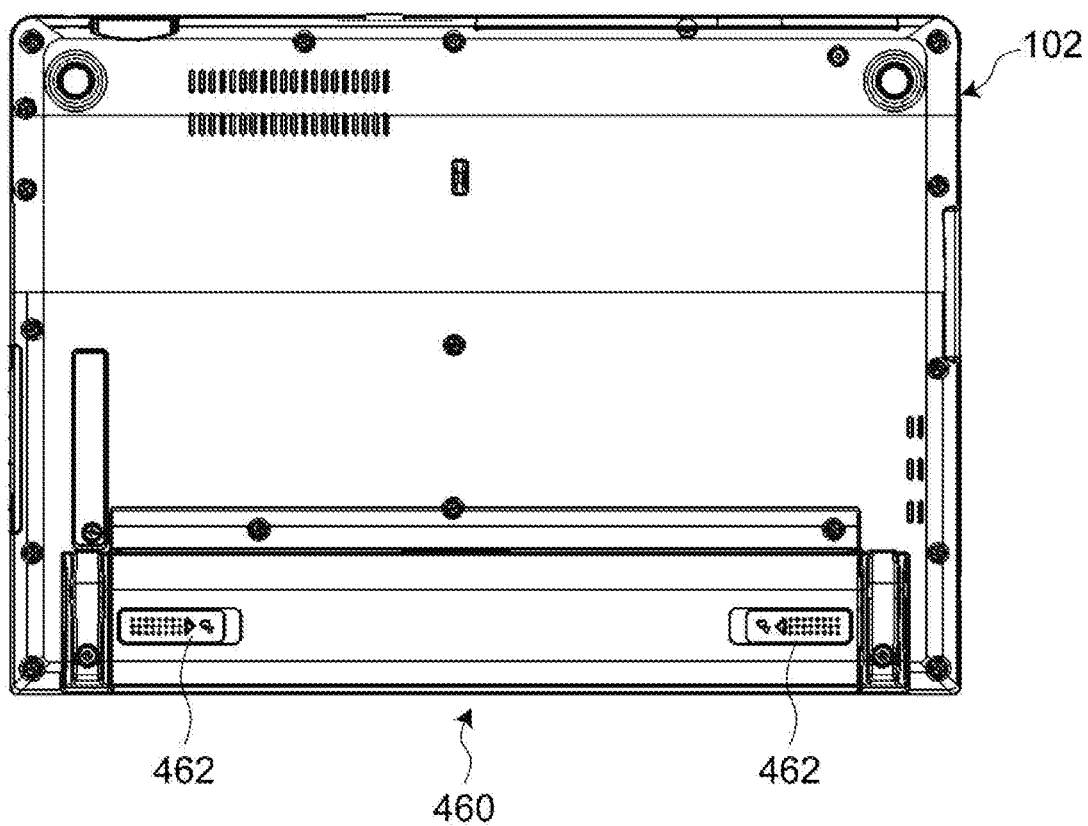
FIG. 2 is a bottom view of a second casing of a computer.
Figure 3:
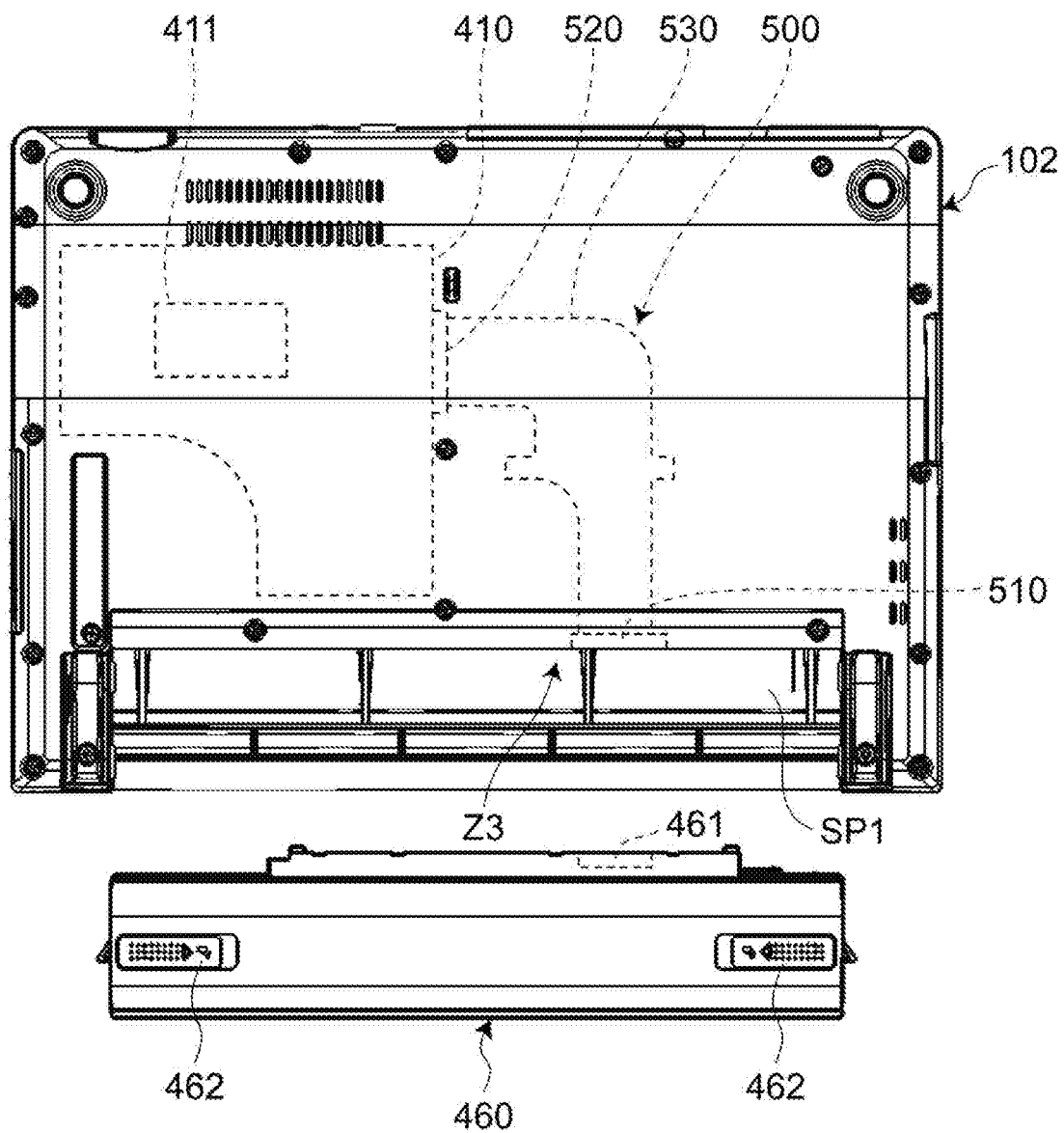
FIG. 3 is a bottom view of a second casing of the computer shown in a state where the battery unit is removed.

FIG. 2 is a bottom view of the second casing 102 of the computer 100. FIG. 3 is a bottom view of the second casing 102 of the computer 100 shown in a state where a battery unit is removed.

A battery unit 460 which is attachable to and detachable from the second casing 102 is mounted on one end side of the lower surface of the second casing 102, as shown in FIGS. 2 and 3. The battery unit 460 can be detached from the second casing 102 by operating the operation knob 462.

Figure 4A:
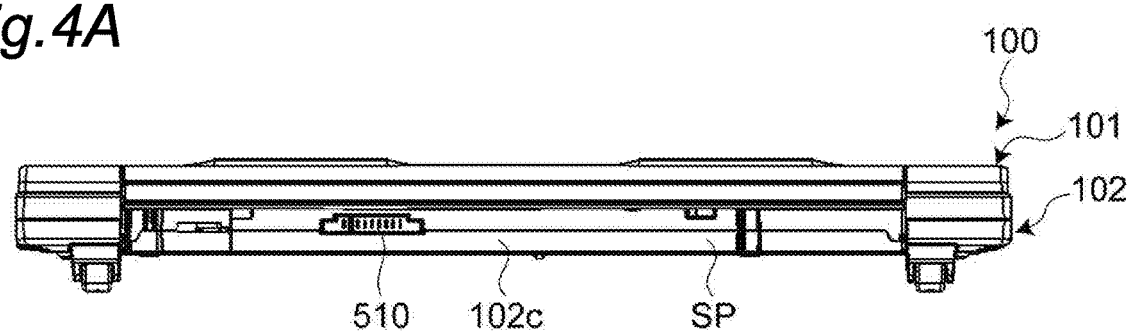
FIG. 4A is a rear view of a computer shown in a state where a battery unit is removed.
Figure 4B:
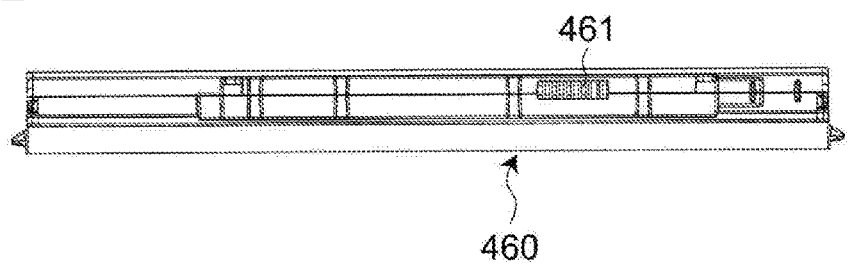
FIG. 4B is a front view of the battery unit.
Figure 5:
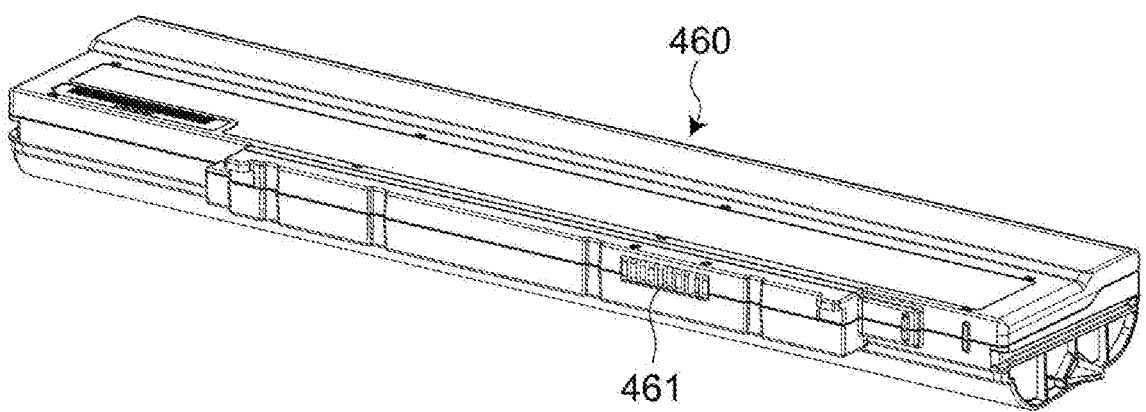
FIG. 5 is perspective view of a battery unit.

FIG. 4A is a rear view of the computer 100 shown in a state where the battery unit 460 is removed, and FIG. 4B is a front view of the battery unit 460. FIG. 5 is a perspective view of the battery unit 460.

As shown in FIGS. 3, 4A, 4B and 5, a connector 461 is provided on one side part of the battery unit 460. The connector 461 is electrically connected and fixed to a circuit board built in the battery unit 460 by solder.

As shown in FIG. 1, the second casing 102 has an upper casing 102A constituting an upper surface side thereof and a lower casing 102B constituting a lower surface side thereof. At least the upper casing 102A of the upper casing 102A and the lower casing 102B is formed using an alloy such as a conductive metal or a magnesium alloy.

Figure 9:
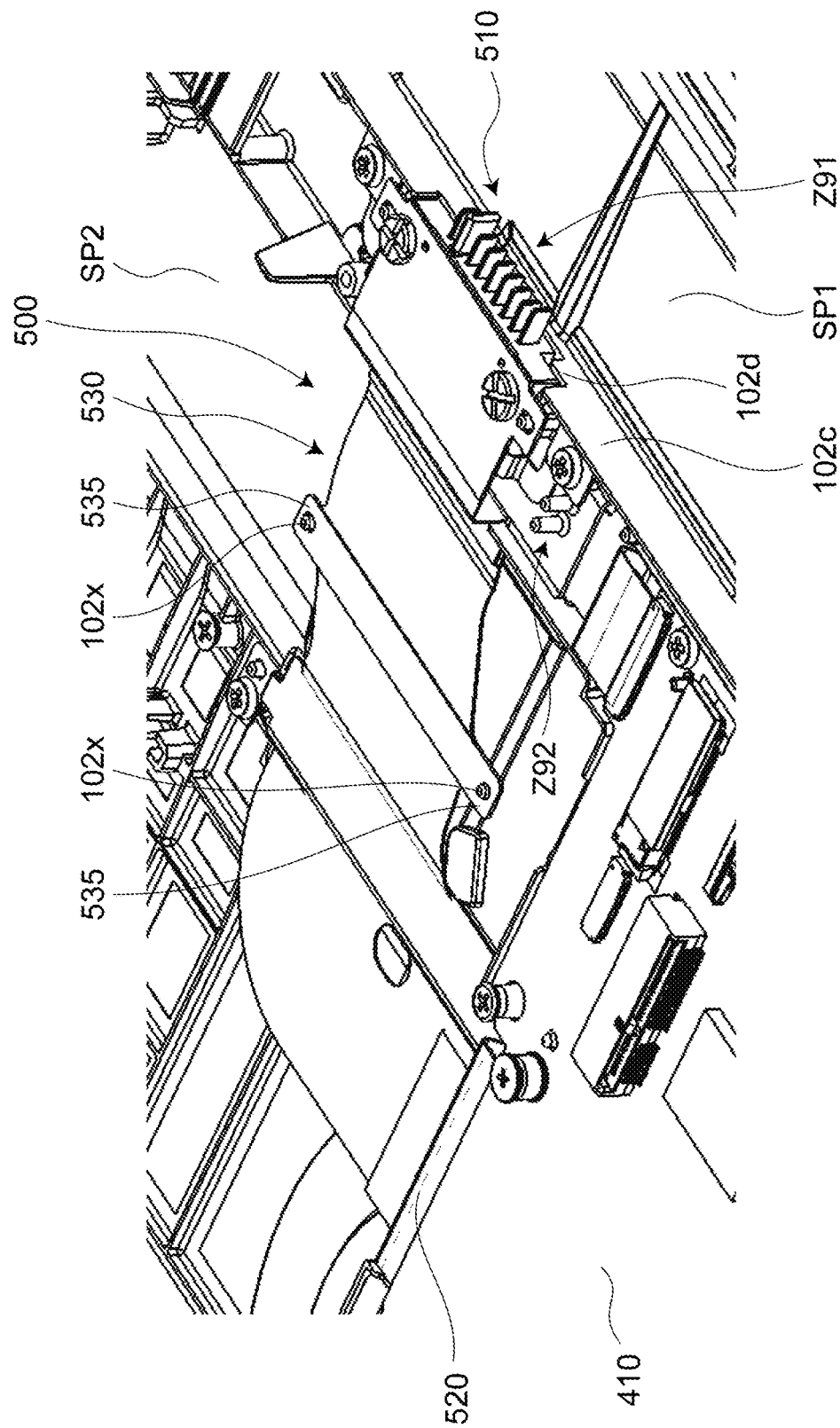
FIG. 9 is a perspective view seen from the direction of an arrow z3 of FIG. 3 in a state where the lower casing is removed.

FIG. 9 is a perspective view of the second casing 102 as viewed from the direction of an arrow Z3 in FIG. 3 in a state where the lower casing 102B is removed.

As shown in FIGS. 3, 4A, 4B and 9, the second casing 102 is provided with a vertical wall part 102c for partitioning an internal space into a battery housing space SP1 and a main space SP2. A connector 510 connected to the connector 461 of the battery unit 460 is provided on the vertical wall part 102C. The connector 510 is exposed to the battery housing space SP1 via a connector arrangement cutout 102d formed in the vertical wall part 102C.

As shown in FIG. 3, a circuit board 410 on which an electronic component such as the CPU 411 is mounted is arranged inside the second casing 102. As shown in FIGS. 3 and 9, a flexible printed circuit board 530 (FPC) for connecting the circuit board 410 and the connector 510 is arranged inside the second casing 102.

Figure 6A:
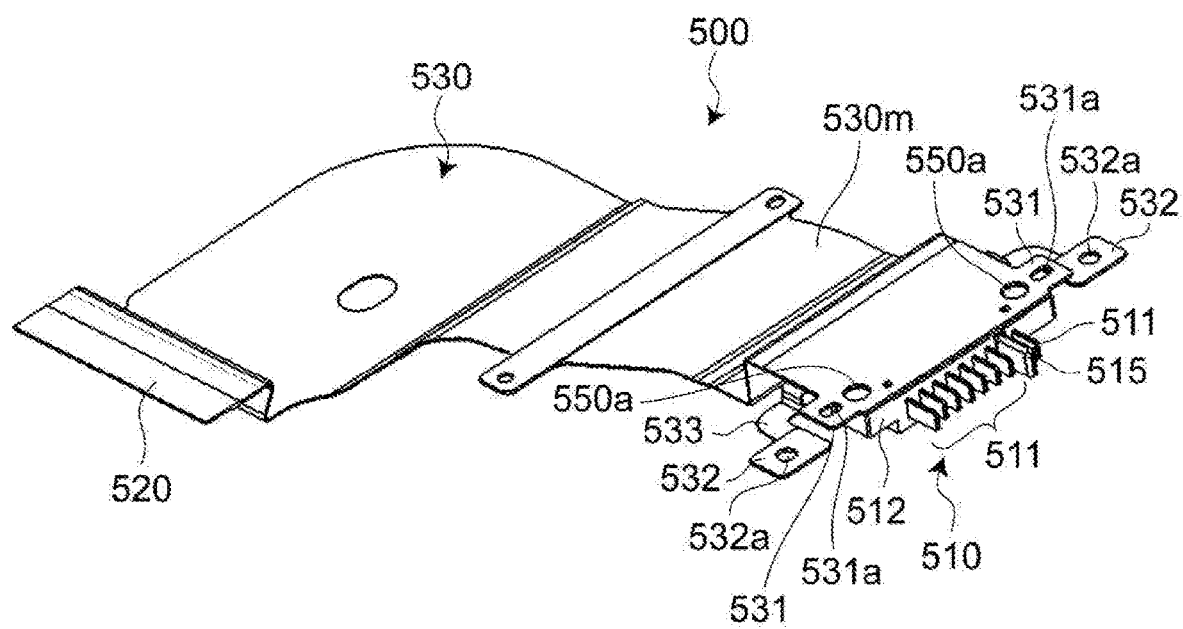
FIG. 6A is a perspective view of a flexible printed board unit.
Figure 6B:
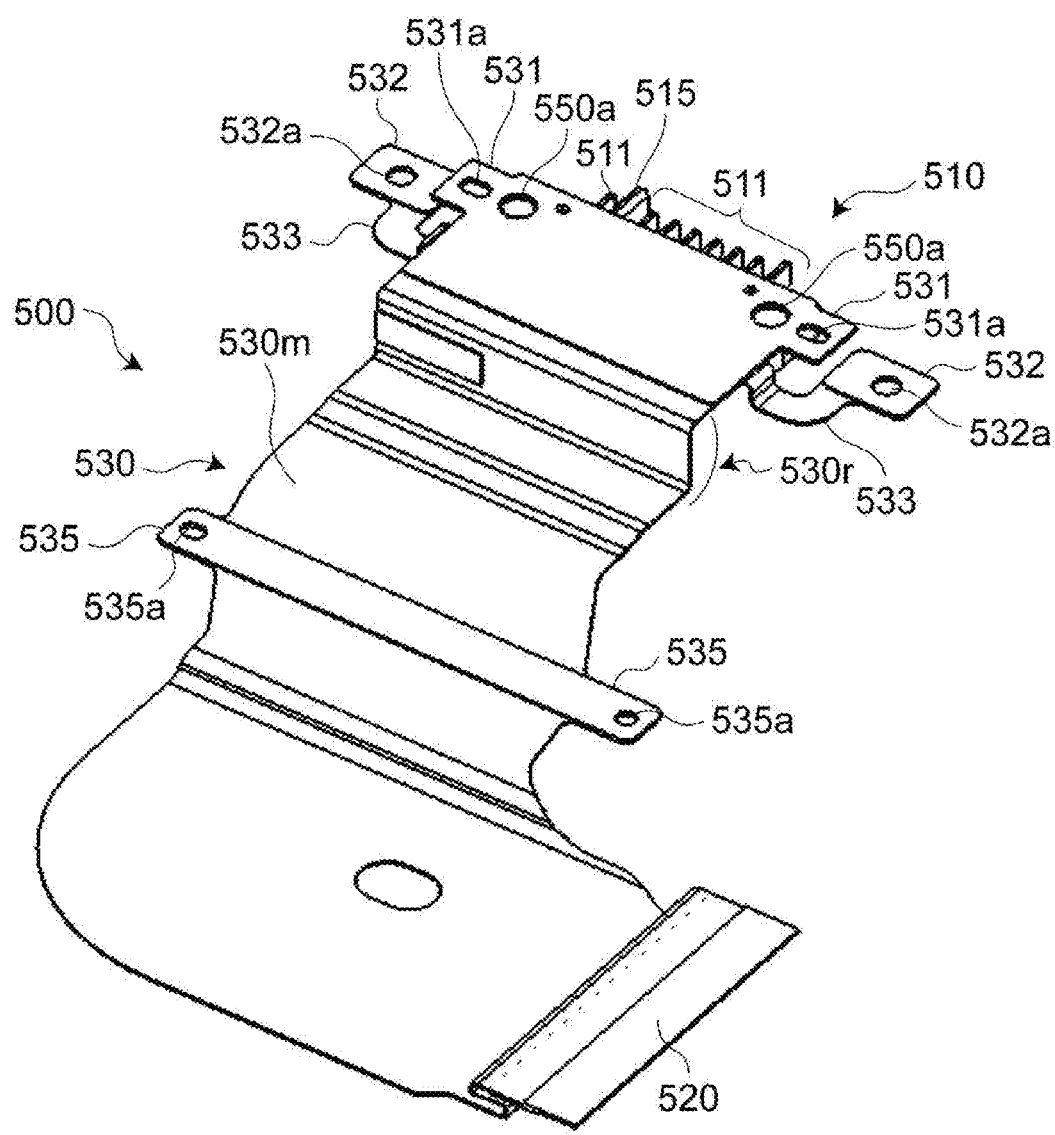
FIG. 6B is a perspective view of a flexible printed board unit.
Figure 7:
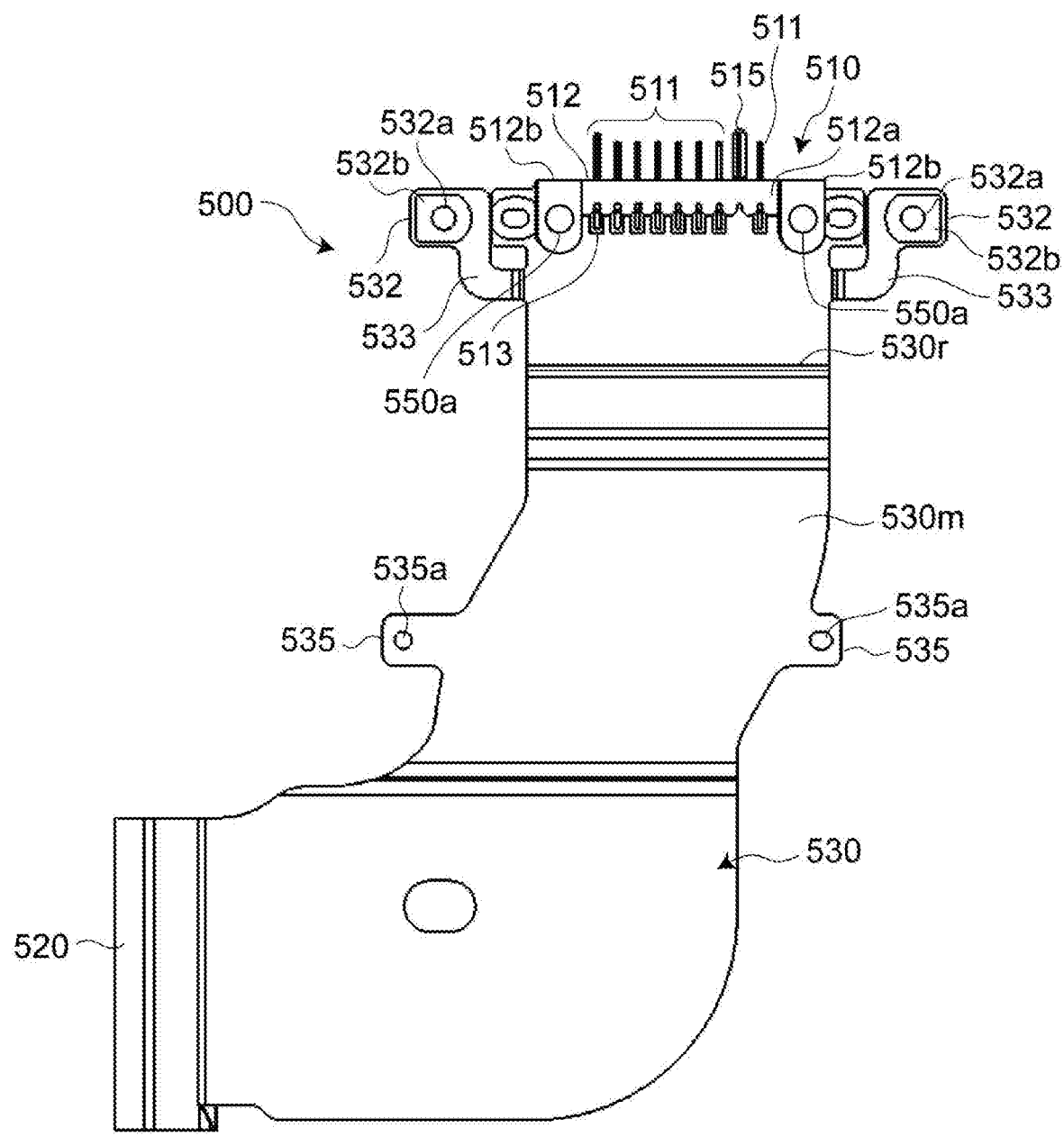
FIG. 7 is a view showing a fixed surface side of the flexible printed circuit board unit.

Next, a structure of the flexible printed circuit board unit will be described. FIG. 6A is a perspective view of the flexible printed circuit board unit. FIG. 6B is a perspective view of the flexible printed circuit board unit. FIG. 7 is a view showing a fixed surface side of the flexible printed circuit board unit.

As shown in FIGS. 6A to 7, the connector 510 and the flexible printed circuit board 530 are configured as one flexible printed circuit board unit 500. The flexible printed circuit board 530 has a shape extending like a belt and like an L-shape. The flexible printed circuit board 530 includes a base film layer made of a resin such as polyimide; a ground layer formed on one surface of the base film by a metal foil in a solid state; and a wring pattern layer formed of a metal on the other surface of the base film. An insulating cover layer made of a nonconductive sheet or the like is formed on the ground layer and the wiring pattern layer. The flexible printed circuit board according to the present disclosure is not limited to this configuration. Each material constituting each layer of the flexible printed circuit board 530 has flexibility capable of being bent. Therefore, the flexible printed circuit board 530 has flexibility capable of being flexibly bent.

In the flexible printed circuit board 530, a terminal part 520 electrically connected to a connector (not shown) provided on the circuit board 410 is provided at an end part opposite to an end part where the connector 510 is connected in an extending direction of the flexible printed board 530.

A locking part 535 having a locking hole 535a fitted to the locking projection 102x of the upper casing 102A is provided at an intermediate part in the extending direction of the flexible printed circuit board 530.

A main body 530m of the flexible printed circuit board 530 has a shape extending like belt, and has a bent part 530r in the middle of the extending direction.

FIG. 8A is an end view of a connection end face of the connector 510 of a flexible printed circuit board unit 500. FIG. 8B is an enlarged view of fixed surface side of the connector 510 part of a flexible printed circuit board unit 500.

A plurality of connection terminals 511 are arranged on a connection end face a base body 512 of the connector 510 of a flexible printed circuit board unit 500. A connection end face of the base body 512 of the connector 510 is provided with a positioning protrusion 515 for positioning the battery unit 460 when the battery unit 460 is inserted into the connector 461.

The base body 512 of the connector 510 is fixed to the flexible printed circuit board 530 using an adhesive or the like. A base 511t of each connection terminal 511 of the connector 510 is connected to a wiring 530a constituting a wiring pattern formed on the main body 530m of the flexible printed circuit board 530 by using solder. The wiring 530a includes not only the power supply line but also a control signal line and a ground line for controlling charging of the battery unit 460. The ground line is connected to the ground layer via a through hole or the like.

A first screw insertion hole 550a through which a first screw 551 is inserted is provided at a mounting part 512b which is provided at each end in a connector width direction of the base body 512 of the connector 510 and an end part of the flexible printed circuit board 530 which is overlapped with a mounting part 512b, the first screw insertion hole 550a penetrating the mounting part 512b and the end part of the flexible printed circuit board 530.

A protruding part 531 is provided on the connection end side of the flexible printed circuit board 530 so as to protrude in the connector width direction. The protruding part 531 is provided with a guide hole 531a.

The flexible printed circuit board 530 is provided with an extension part 533 extending from the main body 530m in the connector width direction. A mounting part 532 fixed to the second casing 102 is provided at the tip of the extension part 533. The mounting part 532 is provided with a second screw insertion hole 532*a* through which the second screw 552 is inserted. The extension part 533 is formed to connect to the main body 530*m*, and has the same plurality of layers as the main body 530*m*. Therefore, the ground layer extends to the mounting part 532.

The extension part 533 extends from a side part of the main body 530*m* in the thickness direction of the flexible printed circuit board 530, bends into an L-shape in the middle of extending, and extends parallel to the main body 530*m*. The extension part 533 is bent into an L-shape as viewed in the axial direction of the second screw insertion hole 532*a* in a part extending parallel to the main body 530*m*. Since the extension part 533 has flexibility in the same manner as the main body 530*m*, L-shaped bends are developed and compressed to expand and contract. In particular, since the extension part 533 has two L-shaped bends, the extension part 533 can expand and contract with a larger expansion/contraction amount.

A ground terminal 532*b* is provided on a fixed surface of the mounting part 532 (a surface in contact with the top surface of a second boss 102*h* in a state in which the mounting part 532 is fixed to the second boss 102*h* to be described later) of the lower casing (see FIG. 7). The ground terminal 532*b* is formed by, for example, gold plating. The ground terminal 532*b* is electrically connected to the ground layer extending to the mounting part 532 through a through-hole via or the like.

Figure 10:
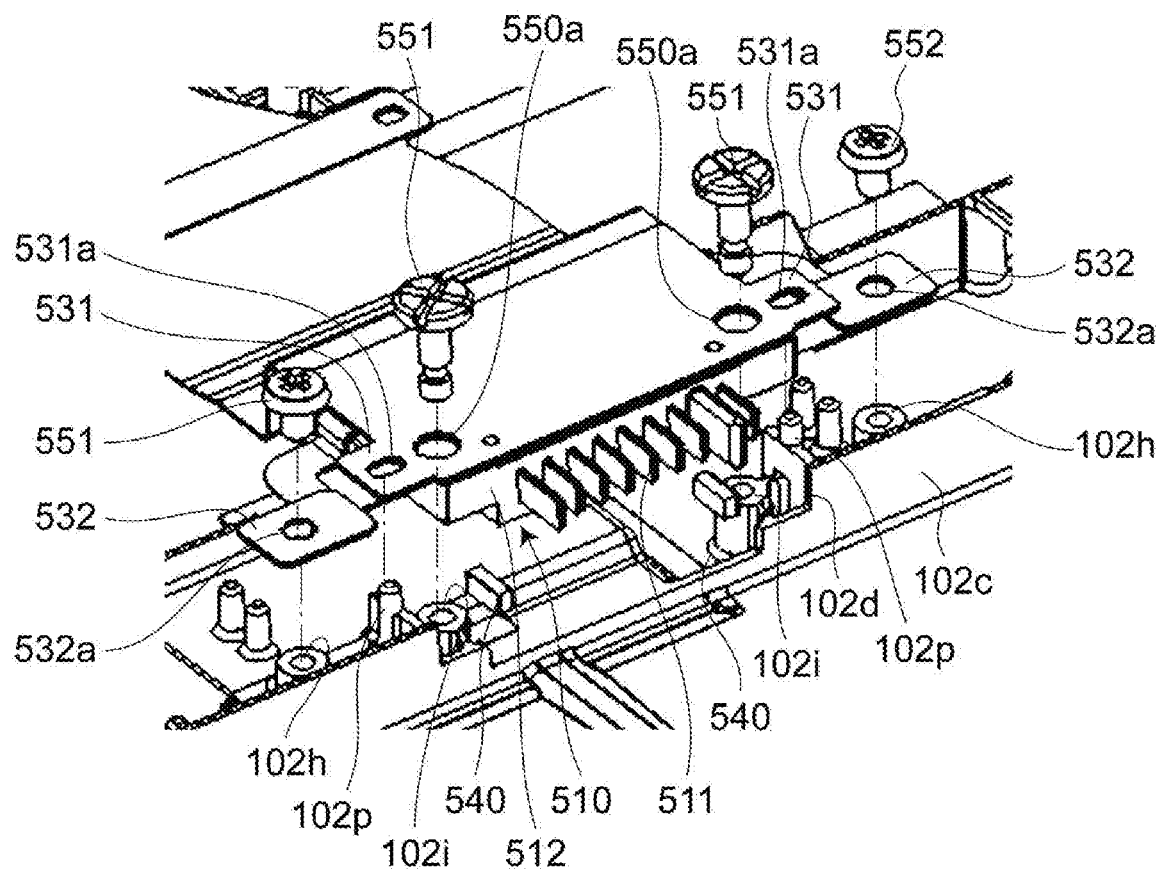
FIG. 10 is an enlarged perspective view of a part shown by an arrow z91 of FIG. 9 in a disassembled state.
Figure 11:
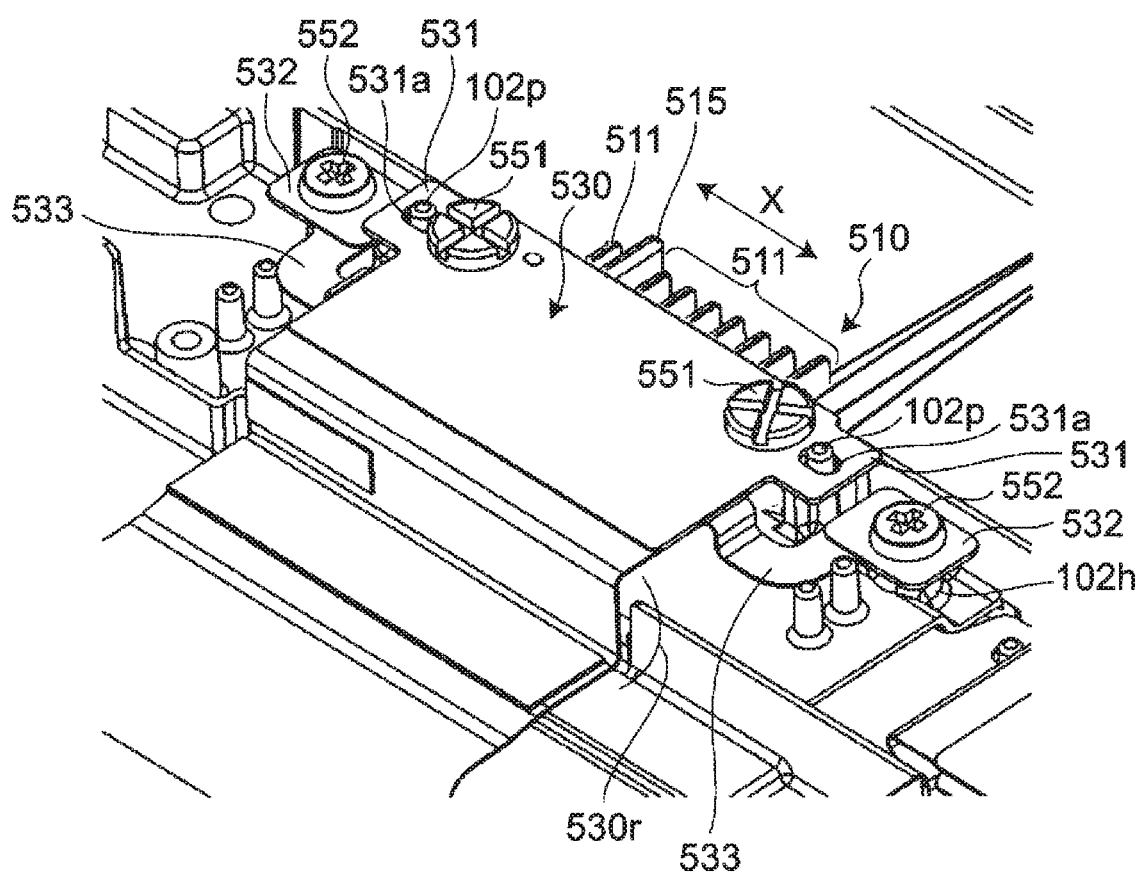
FIG. 11 is an enlarged perspective view of a part indicated by an arrow z92 in FIG. 9.
Figure 12:
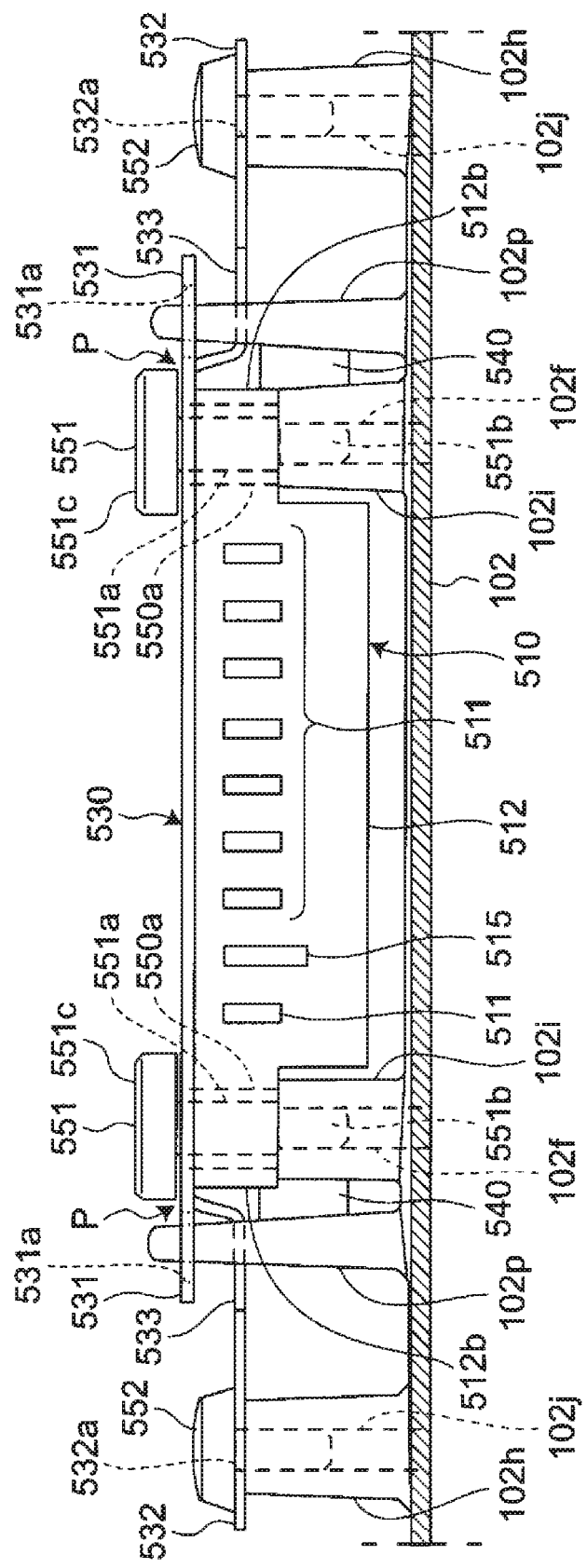
FIG. 12 is a view showing a part on which a connector is arranged in a second casing of which vertical wall part is broken, in a state as viewed from a connection end face side of the connector.

Next, a mounting structure of the connector 510 of the flexible printed circuit board unit 500 to the second casing 102 will be described. FIG. 10 is an enlarged perspective view showing a part indicated by an arrow z91 in FIG. 9 in a disassembled state. FIG. 11 is an enlarged perspective view of a part indicated by an arrow z92 in FIG. 9. FIG. 12 is a view showing the flexible printed circuit board unit 500 mounted on the second casing 102 of which vertical wall part is broken, in a state as viewed from the connection end face side of the connector 510.

As shown in FIGS. 10, 11, and 12, a pair of first bosses 102*i* are formed on the upper casing 102A, near the connector arrangement cutout 102*d* of the vertical wall part 102*c*, in the main space SP2 side. Each first boss 102*i* has a first screw hole 102*f* in which the first screw 551 is screwed through the first screw insertion hole 550*a* of the connector 510. A second boss 102*h* is formed on the outside of the first boss 102*i* in the connector width direction. The second boss 102*h* has a second screw hole 102*j* in which the second screw 552 is screwed through the second screw insertion hole 532*a* of the mounting part 532 of the flexible printed circuit board 530. The height of the first boss 102*i* is set higher than the height of the second boss 102*h*.

A guide pin 102*p* is formed on the upper casing 102A between the first boss 102*i* and the second boss 102*h*. The guide pin 102*p* is inserted into the guide hole 531*a* of a protruding part 531 of the flexible printed circuit board 530. The guide hole 531*a* has a length sufficiently larger than the diameter of the guide pin 102*p* in the connector width direction, and is a long hole formed to have substantially the same length as the diameter of the guide pin 102*p* in the connector depth direction.

On the top surface of the second boss 102*h*, the mounting part 532 of the flexible printed circuit board 530 is fixed in a state sandwiched between the top surface of the second boss 102*h* and the head surface of the head of the second screw 552. In a fixed state, the ground terminal 532*b* of the mounting part 532 is brought into pressure contact with the top surface of the second boss 102*h*, and is brought into close contact with the top surface of the second boss 102*h*.

The first screw 551 is a stepped screw having a large diameter part 551*a* larger than the diameter of a screw part 551*b* between a head 551*c* and the screw part 551*b* in the axial direction. The first screw insertion hole 550*a* has a diameter larger than the diameter of the screw part 551*b* of the first screw 551 and the diameter of the large diameter part 551*a*. The first screw 551 is screwed into the first screw hole 102*f* through the first screw insertion hole 550*a*, and the screw part 551*b* side end face of the large diameter part 551*a* abuts on the top face of the first boss 102*i*. The axial length of the large diameter part 551*a* is set to be larger than the thickness of the mounting part 512*b* of the base body 512 of the connector 510 and the main body 530*m* of the flexible printed circuit board 530. Therefore, a minute gap P exists in the axial direction of the first screw 551, and the first screw 551 does not press the connector 510 to the top surface of the first boss 102*i*. The mounting part 532 of the flexible printed circuit board 530 fixed to the upper casing 102A is connected to the main body 530*m* via the extension part 533 having bending. The main body 530*m* of the flexible printed circuit board 530 has flexibility. With these structures, the connector 510 is movable (floating) in the casing width direction and the casing thickness direction (in the same direction as the connector thickness direction in the present embodiment) to the upper casing 102A (second casing 102) in a state that the first screw 551 is screwed into the first screw hole 102*f* through the first screw insertion hole 550A. By setting the short diameter of the guide hole 531*a* to a diameter larger than the diameter of the guide pin 102*p*, the connector 510 can be moved in the casing depth direction. The movable amount of the connector 510 in the casing width direction with respect to the second casing 102 is set to be larger than the backlash amount in the casing width direction within the battery housing space SP1 of the battery unit 460. The movable amount can be set as a difference between the diameter of the first screw insertion hole 550*a* and the diameter of the large diameter part 551*a* of the first screw 551.

An elastic body 540 made of rubber is disposed between the mounting part 512*b* of the base body 512 of the connector 510 and the guide pin 102*p*. The elastic body 540 is sandwiched and compressed by the mounting part 512*b* and the guide pin 102*p*. The elastic body 540 has, for example, a rectangular parallelepiped shape in an uncompressed initial state. Although, in FIG. 12, the elastic body 540 is deformed according to the shape of members that contact to the elastic body 540. By providing the elastic body 540, even when the connector 510 can be moved as described above, the connector 510 is easily held at a fixed position by the urging force of the right and left elastic bodies 540. Further, the connector 510 is prevented from unnecessarily rattling with respect to the second casing 102.

Figure 13:
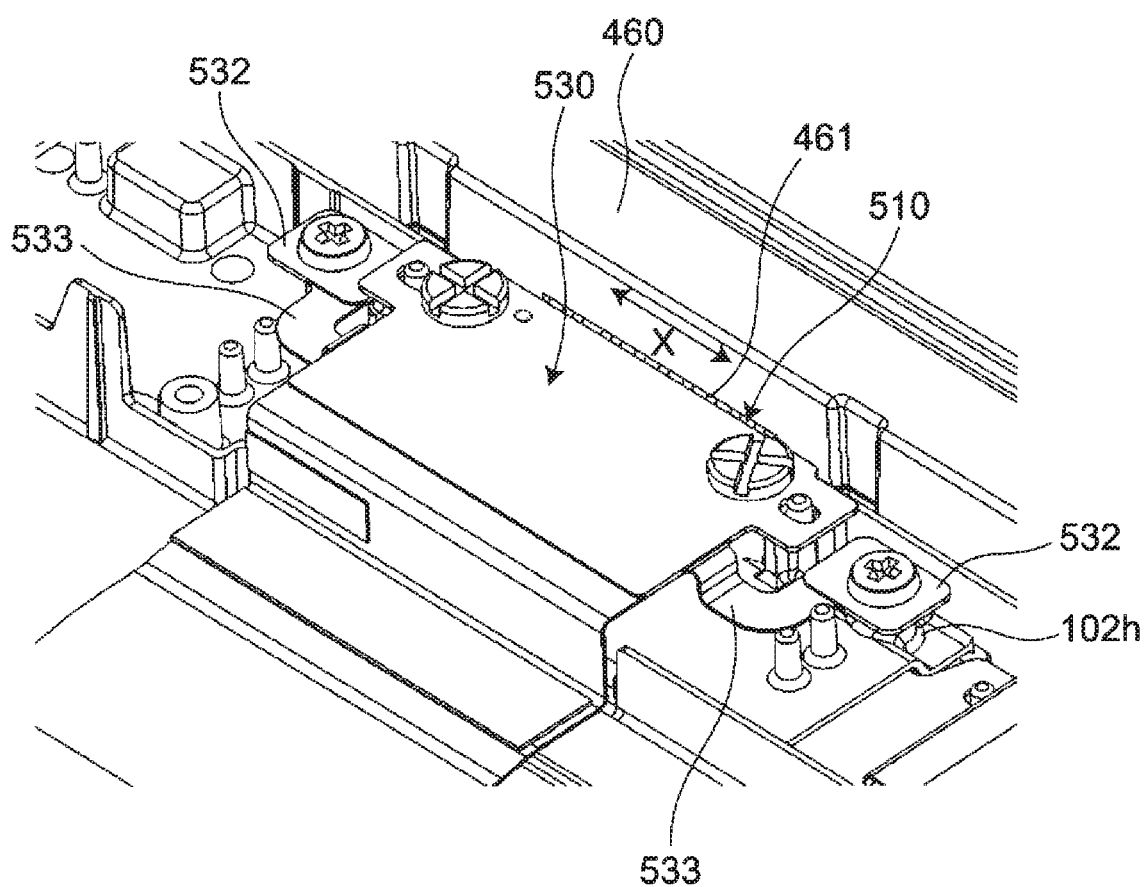
FIG. 13 is a perspective view corresponding to FIG. 11 showing, the battery unit in a state in which the battery unit is attached to the second casing

Next, the operation of the connector mounting structure described above will be described. FIG. 13 is a perspective view corresponding to FIG. 11 showing the battery unit 460 in a state in which the battery unit 460 is mounted on the second casing 102.

The dimension of the battery housing space SP1 in the casing width direction is set to be slightly larger than the dimension in the width direction of the battery unit 460 that is mounted so that the battery unit 460 can be easily mounted. Therefore, when the computer 100 in a state in which the battery unit 460 is attached to the second casing 102 drops due to, for example, an user's trouble and collides with a floor or the like, the battery unit 460 moves in the casing width direction X of the connector 510 in the battery housing space SP1 as shown in FIG. 13. In this embodiment, the connector 510 is movably attached to the second casing 102 as described above. Therefore, when the relative movement occurs between the battery unit 460 and the second casing 102, the connector 510 moves relative to the casing width direction X. Therefore, even if the above collision occurs, it is suppressed that an impact is applied to the connection part between the base part 511*t* of the connection terminal 511 of the connector 510 and the wiring 530*a* of the main body 530*m*. Accordingly, the occurrence of destruction in the solder and the like of the connection part is suppressed. In addition, since the connector 510 of the second casing 102 is moved, it is suppressed that an impact is applied to the connection part between the substrate of the battery unit 460 and the connector 461. Therefore, destruction of the solder of the connection part in the battery unit 460 is suppressed.

Since the bent part 530*r* is provided in the middle of the extension direction of the main body 530*m* of the flexible printed circuit board 530, when the connector 510 is moved in the casing width direction as described above, the bent part 530*r* develops or compresses. Thus, the stress applied to the main body 530*m* is reduced.

In the present embodiment, a ground of the main body 530*m* of the flexible printed circuit board 530 is extended to the ground terminal 532*b* of the mounting part 532 via the extension part 533, and the mounting part 532 is fixed by being sandwiched between a top face of the second boss 102*h* and a head of the second screw 552 in a state in which the ground terminal 532*b* of the mounting part 532 is brought into contact with the top face of the second boss 102*h*. Therefore, the ground of the main body 530*m* of the flexible printed circuit board 530 can be contacted to the second casing 102. Thus, the generation of EMI noise caused by the wiring 530*a* of the flexible printed circuit board 530 can be suppressed. Further, since the extension part 533 and the mounting part 532 for ground connection are integrally provided on the flexible printed circuit board 530, it is not necessary to additionally use a ground connection member such as a conductive cloth, which has been conventionally used, and the number of members can be reduced.

Thus, according to the connector mounting structure of the present embodiment, the connector 510 provided in the electronic apparatus can be moved to the second casing 102, and the connector 510 can be properly ground-connected.

1-2. Effect, Etc.

(1) The computer 100 (one example of the electronic apparatus) according to the present embodiment includes:

the flexible printed circuit board 530 having the main body 530*m* on which the wiring pattern is formed, the connector 510 having the connection terminal 511 connected to the wiring 530*a* constituting the wiring pattern, and the base body 512 fixed with the connection terminal 511 and having insulation properties, and the second casing 102 (casing) for housing the connector 510 and the flexible printed circuit board 530, wherein the base body 512 is movably attached to the second casing 102, the flexible printed circuit board 530 has the extension part 533 protruding from the main body 530*m* and extending along with the ground included in the wiring pattern, the extension part 533 bends in the middle of extending to be capable of expansion and contraction, and has the mounting part 532 fixed to the second casing 102 on the tip side thereof, the mounting part 532 is provided with the ground terminal 532*b* electrically connected to the extended ground, and the ground terminal 532*b* is electrically connected to the second casing 102 in the state that the mounting part 532 is fixed to the second casing 102.

Thus, the connector 510 and the ground of the flexible printed board 530 can be properly connected to the second casing 102 while allowing the connector 510 to be moved to the second casing 102. Therefore, the occurrence of noise such as EMI noise can be suppressed while absorbing the impact acting on the connector 510.

(2) In the computer 100 of the present embodiment, the extension part 533 is bent into the L-shape in the middle of extending.

Thus, the extension part 533 can be expanded and contracted with a simple shape.

(3) In the computer 100 of the present embodiment, the main body 530*m* of the flexible printed circuit board 530 has the shape extending in a belt, and has the bent part 530*r* in the middle of the extending direction.

Thus, when the connector 510 is moved, the bent part 530*r* is expanded or contracted, thereby relaxing stress applied to the main body 530*m*.

(4) In the computer 100 of the present embodiment, the base body 512 has the first screw insertion hole 550*a* through which the first screw 551 is inserted, the second casing 102 has the first screw hole 102*f* in which the first screw 551 is screwed through the first screw insertion hole 550*a*, the diameter of the first screw insertion hole 550*a* is larger than the diameter of the screw part 551*b* of the first screw 551.

Thus, with a simple structure, the connector 510 can be moved in a direction perpendicular to the axial direction of the first screw 551 with respect to the second casing 102.

(5) In the computer 100 of the present embodiment, the mounting part 532 has the second screw insertion hole 532*a* through which the second screw 552 is inserted, the second casing 102 further has the second screw hole 102*j* in which the second screw 552 is screwed through the second screw insertion hole 532*a*, the mounting part 532 is fixed to the second casing 102 when the second screw 552 is screwed into the second screw hole 102*j* through the second screw insertion hole 532*a*.

Thereby, the mounting part 532 can be fixed to the second casing 102 with a simple structure, and the ground terminal 532*b* of the mounting part 532 can be electrically connected to the second casing 102 firmly.

(6) In the computer 100 of the present embodiment, the base part 511*t* of the connection terminal 511 and the wiring 530*a* of the main body 530*m* of the flexible printed circuit board 530 are connected by solder.

In this embodiment, since the connector 510 is movable, it is suppressed that an impact is applied to the solder connecting the base part 511*t* of the connection terminal 511 of the connector 510 and the wiring 530*a* of the main body 530*m* of the flexible printed circuit board 530. Therefore, destruction of the connection part using solder is suppressed.

(7) In the computer 100 of the present embodiment, the computer 100 (electronic apparatus) is a computer having the battery housing space SP1 (housing space) for detachably housing the battery unit 460, the connector 510 is connected to the connector 461 of the battery unit 460.

Since a battery unit is a member having a relatively large weight among components of a computer, when a drop or the like occurs, an impact is applied to the connector of the casing and the connector of the battery unit. At this time, the above-described breakage of the solder or the like sometimes occurs in the conventional technique. However, according to the present embodiment, by adopting the configuration described above, generation of noise such as EMI noise can be suppressed while absorbing impact acting on the connector 510 and the connector 461.

Embodiment 2

Embodiment 2 will be described.

Figure 14A:
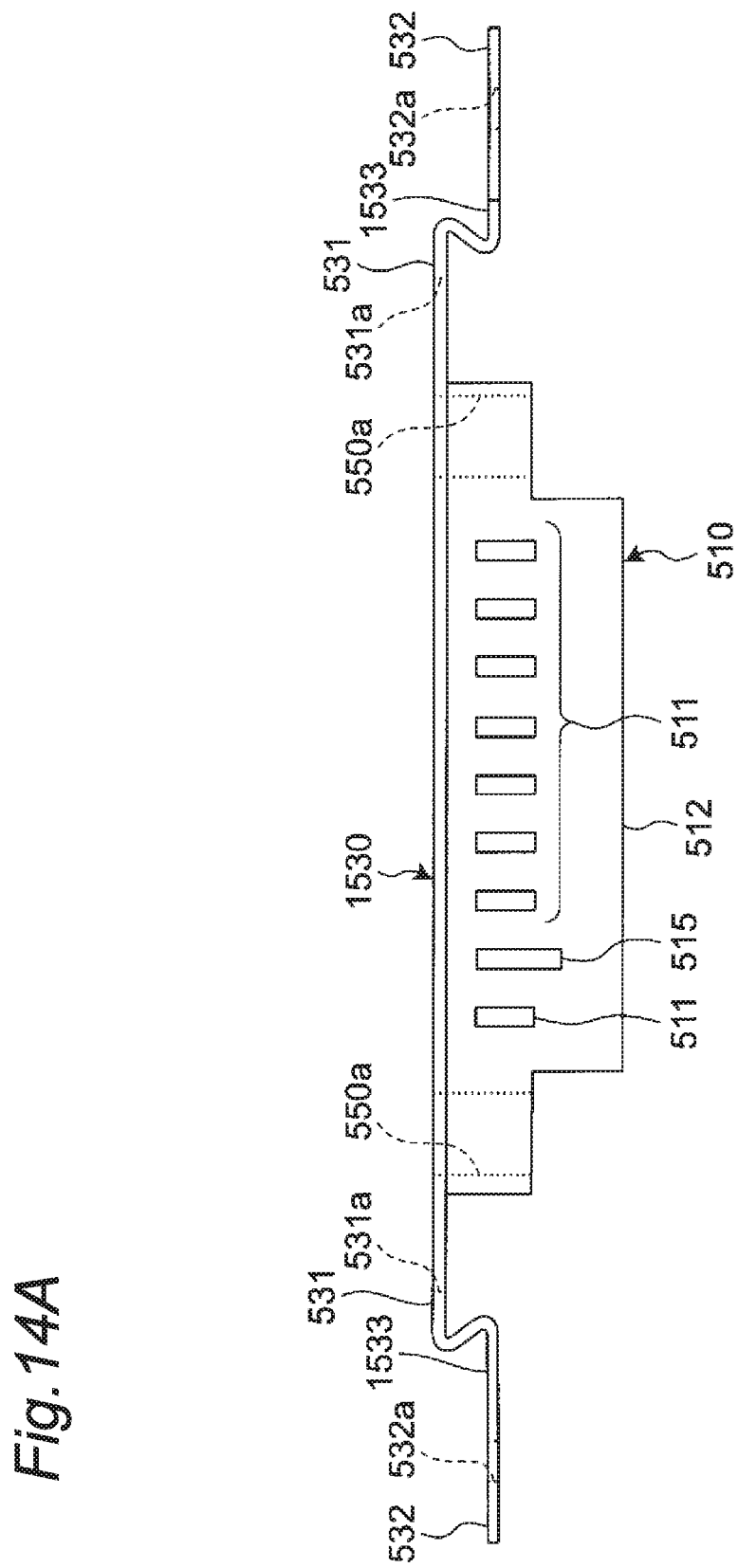
FIG. 14A is an end view of a connection end face of the connector of the flexible printed board unit according to the second embodiment.
Figure 14B:
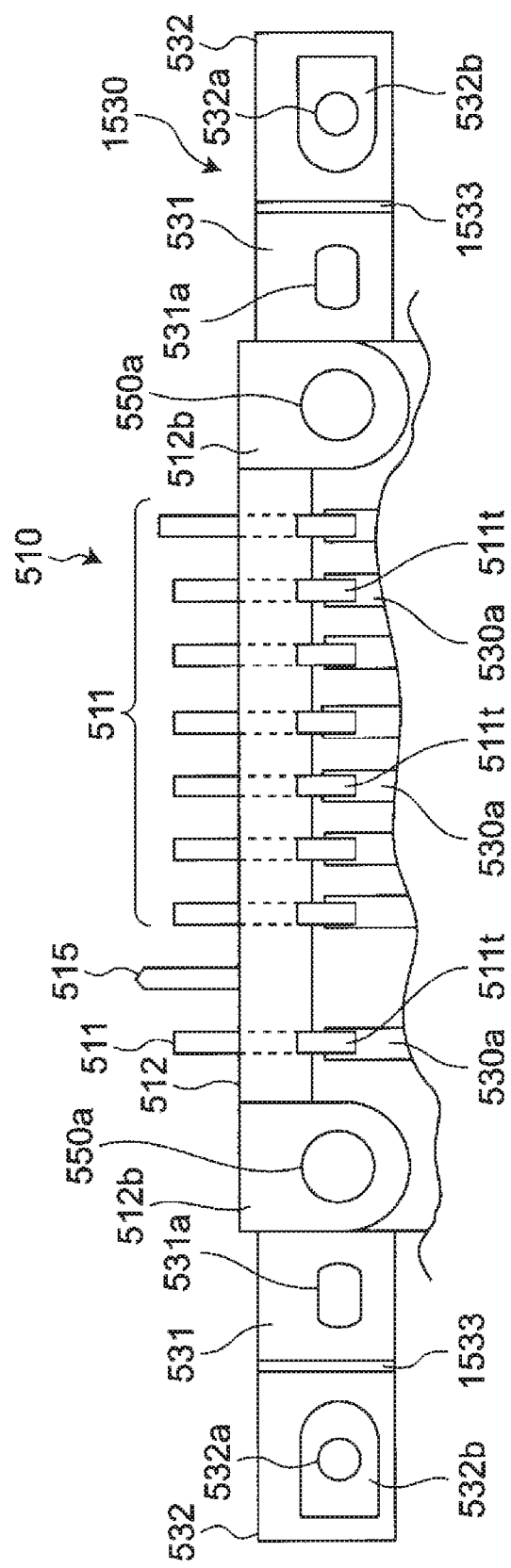
FIG. 14B is an enlarged view of a fixed surface side of a connector of the flexible printed circuit board unit according to the second embodiment.

FIG. 14A is an end view of a connection end face of the connector of the flexible printed board unit according to the second embodiment. FIG. 14B is an enlarged view of a fixed surface side of a connector of the flexible printed circuit board unit according to the second embodiment.

In the flexible printed circuit board 530 of the first embodiment, the protruding part 531 and the extension part 533 are provided separately from the main body 530m. However, the method of providing the extension part to the flexible printed circuit board is not limited to this. For example, as shown in FIGS. 14A and 14B, in the flexible printed circuit board unit according to the second embodiment, a protruding part 531 is integrally provided on an extension part 1533 protruding from a flexible printed circuit board 1530 and extended in d connector width direction, and the mounting part 532 is provided on the p side of the extension part 1533. The extension part 1533 is bent into a substantially Z-shape when viewed in a direction perpendicular to the connection end face of the connector 510. The first screw insertion hole 550a, the second screw insertion hole 532a, and the guide hole 531a are arranged in the same positional relationship as in the first embodiment. The flexible printed circuit board unit is attached to the second casing 102 by using the same first screw 551 and the second screw 552 as in the first embodiment. Other structures are the same as those of the first embodiment.

In this embodiment, the same effect as the first embodiment can be obtained while simplifying the structure of the flexible printed circuit board 1530. Since the length of the extension part 533 of the first embodiment is more likely to be longer than that of this embodiment, the relative movement of the connector 510 to the second casing 102 is more easily absorbed.

Other Embodiment

As described above, an exemplary embodiment 1 is described as an example of the technique disclosed in the present application. However, the technique of the present disclosure is not limited to this, and can be applied to an embodiment in which a change, replacement, addition, omission, or the like is performed as appropriate. Further, the components described in the first embodiment may be combined to form a new embodiment. The following is an exemplary embodiment of the present invention.

(1) In the embodiment, an electronic apparatus according to the present disclosure is applied to a notebook computer. However, the present disclosure is applicable to various electronic apparatuses such as a smart phone, a tablet computer, a portable game apparatus, and a digital camera, in addition to a notebook computer.

As described above, an embodiment the technique according the present disclosure is described. Accordingly, the accompanying drawings and the detailed description are provided. Accordingly, among the components described in the accompanying drawings and the detailed description, not only components essential for solving the problem, also components that are not essential for solving the problem may be included in order to illustrate the above-described technique. Therefore, it should not be construed that the non-essential components are required to be essential when components that are not essential are described in the accompanying drawings or detailed description. Furthermore, since the above-described embodiment is intended to illustrate the technique of the present disclosure, various changes, substitutions, additions, omissions, and the like can be made within the scope of the claims or the equivalents thereof.

INDUSTRIAL APPLICABILITY

The present disclosure is widely available in an electronic apparatus having a connector.

What is claimed is:
1. An electronic apparatus comprising:
a flexible printed circuit board having a main body on which wiring pattern is formed,
a connector having a connection terminal connected to the wiring constituting the wiring pattern, and a base body on which the connection terminal is fixed and has insulation property, and
a casing housing the connector and the flexible printed circuit board, wherein
the flexible printed circuit board has an extension part protruding continuously from the main body and extending along with a ground included in the wiring pattern,
the extension part bends in the middle of extending to be capable of expansion and contraction, and has a mounting part fixed to the casing on the tip side thereof,
the mounting part is provided with a ground terminal connected to the ground extended, and
the ground terminal is electrically connected to the casing in the state that the mounting part is fixed to the casing.
2. The electronic apparatus according to claim 1, wherein the extension part is bent into an L-shape in the middle of extending.
3. The electronic apparatus according to claim 1, wherein the main body has a shape extending like a belt, and has a bent part in the middle of the extending direction.
4. The electronic apparatus according to claim 1, wherein the base body has a first screw insertion hole through which the first screw is inserted,
the casing has a first screw hole in which the first screw is screwed through the first screw insertion hole, and
the diameter of the first screw insertion hole is larger than the diameter of the screw part of the first screw.
5. The electronic apparatus according to claim 1, wherein the mounting part has a second screw insertion hole through which the second screw is inserted,
the casing further includes a second screw hole in which the second screw is screwed through the second screw insertion hole, and
the mounting part is fixed to the casing by screwing the second screw into the second screw hole through the second screw insertion hole.

6. The electronic apparatus according to claim 1, wherein a base part of the connection terminal and a wiring of the main body of the flexible printed circuit board are connected by solder.

7. The electronic apparatus according to claim 1, wherein
the electronic apparatus is a computer having a housing space for detachably housing a battery unit, and
the connector is connected to a connector of the battery unit.

* * * * *